United States Patent [19]

Kitagawa et al.

[11] Patent Number: 5,616,937

[45] Date of Patent: *Apr. 1, 1997

[54] COMPOUND SEMICONDUCTOR LUMINESCENT DEVICE

[75] Inventors: Masahiko Kitagawa, Nara-ken; Yoshitaka Tomomura, Nara, both of Japan

[73] Assignee: Sharp Kabushiki Kaisha, Osaka, Japan

[ * ] Notice: The term of this patent shall not extend beyond the expiration date of Pat. No. 5,113,233.

[21] Appl. No.: 737,706

[22] Filed: Jul. 30, 1991

Related U.S. Application Data

[62] Division of Ser. No. 402,691, Sep. 1, 1989, Pat. No. 5,113,233.

[30] Foreign Application Priority Data

Sep. 2, 1988 [JP] Japan ............................... 63-221081

[51] Int. Cl.⁶ ...................................... H01L 33/00
[52] U.S. Cl. ....................... 257/94; 257/96; 257/98; 257/103
[58] Field of Search ................. 357/16, 17, 11, 357/61; 313/503, 506, 512; 257/13, 94, 96, 98, 103, 201

[56] References Cited

U.S. PATENT DOCUMENTS

| | | |
|---|---|---|
| 4,137,481 | 1/1979 | Hilsum et al. . |
| 4,482,841 | 11/1984 | Tiku et al. . |
| 4,647,813 | 3/1987 | Kitabayashi et al. . |
| 4,680,602 | 7/1987 | Watanabe et al. . |
| 4,868,615 | 9/1989 | Kamata . |
| 4,988,579 | 1/1991 | Tomomura et al. . |
| 5,103,269 | 4/1992 | Tomomura et al. .......... 257/94 |

FOREIGN PATENT DOCUMENTS

| | | |
|---|---|---|
| 2369640 | 10/1977 | France . |
| 2556548 | 12/1983 | France . |
| 59-11688 | 1/1984 | Japan . |
| 59-172279 | 9/1984 | Japan . |
| 63-1081 | 1/1988 | Japan . |
| 63-213377 | 9/1988 | Japan . |
| 1-157576 | 6/1989 | Japan . |

OTHER PUBLICATIONS

Kolodziejski et al., *Applied Physics Letters* (1988) 52(13):1080–1082.
Kobayashi et al., *Applied Physics* (1985) 57(10):4706–4710.
Mishima et al., *Science* (1987) 238:181–183.
Rutz, *Applied Physics Letters* (1976) 28:379–381.
Walker et al., *J. Applied Physics* (May 1976) 47(5):2129–2132.

*Primary Examiner*—Mahshid D. Saadat
*Assistant Examiner*—Courtney A. Bowers
*Attorney, Agent, or Firm*—Morrison & Foerster LLP

[57] ABSTRACT

A compound semiconductor luminescent device is disclosed which comprises a semiconductor substrate and a multi-layered structure disposed on the substrate, the multi-layered structure comprising at least one conductive layer, a luminescent layer, and a current injection layer, wherein the substrate and the layers are made of at least one kind of II–VI group compound semiconductor.

5 Claims, 3 Drawing Sheets

COMPOUND SEMICONDUCTOR LUMINESCENT DEVICE

CROSS REFERENCE

This application is a divisional of earlier filed U.S. application Ser. No. 07/402,691, filed Sep. 1, 1989, U.S. Pat. No. 5,113,233, which application is incorporated herein by reference and to which application we claim priority under 35 USC §120 and is based on Japanese application 63-221081, filed Sep. 2, 1988, which application is incorporated herein by reference and to which application we claim priority under 35 USC §119.

BACKGROUND OF THE INVENTION

1. Field of the Invention

This invention relates to a compound semiconductor luminescent device, and more particularly, it relates to a II–VI group compound semiconductor luminescent device capable of emitting ultraviolet light.

2. Description of the Prior Art

Compound semiconductor luminescent devices capable of emitting ultraviolet light of a short wavelength are usually produced with aluminum nitride (AlN) or boron nitride (BN), both of which are nitride-type III–V group semiconductor compounds. (see, e.g., R. F. Rutz, Applied Physics Letters, 28 (1976) 379 and O. Mishima, Science, 238 (1987) 181.)

FIG. 5 shows a conventional semiconductor compound luminescent device with a metal-semiconductor (MS) structure using AlN. This luminescent device has a structure in which a metal electrode 52 made of niobium (Nb) and a metal electrode 53 made of Al are disposed on an AlN semiconductor 51. In such a luminescent device, because the AlN semiconductor 51 has a resistivity of about 1000 Ωcm, current of about 0.1 to 20 mA flows when a voltage of several tens to a hundred of volts is applied to this luminescent device, so that light emission over a wide range of about 215 to 500 nm can be obtained.

FIG. 6 shows a conventional pn junction luminescent device using BN. This luminescent device is produced by growing an Si-doped n-type BN semiconductor 61 and a Be-doped p-type semiconductor 62 under a very high pressure at a high temperature, and by providing the n-type BN semiconductor 61 and the p-type BN semiconductor 62 with silver paste electrodes 63 and 64, respectively. When a voltage of several tens of volts or more is applied to such a luminescent device, current of 0.1 to 3 mA flows, so that light emission over a wide range of about 215 to 600 nm can be obtained.

An AlN semiconductor used in the luminescent device shown in FIG. 5 has a problem in that substrate crystals cannot readily be obtained. For this reason, AlN is deposited on a substrate made of, for example, sapphire ($Al_2O_3$), to form an AlN crystal film. Thus, the quality of the crystal is very poor.

A BN semiconductor used in the luminescent device shown in FIG. 6 also has a problem that substrate crystals cannot readily be obtained. Therefore, the luminescent device is produced by growing a very small crystal of about 1 mm in diameter, and by forming electrodes on this crystal particle.

As described above, high-quality crystals of the AlN semiconductor and the BN semiconductor cannot be grown by an ordinary epitaxial growth method such as liquid phase epitaxy, vapor phase epitaxy, molecular beam epitaxy (MBE), or metal organic chemical vapor deposition (MOCVD). Therefore, it is very difficult to obtain epitaxially grown single crystals with excellent crystallinity. Accordingly, luminescent devices in which these semiconductor materials are used requires the application of a high voltage of several tens of volts, and the wavelength of light emitted is over a wide range. Furthermore, these luminescent devices have a disadvantage in that the brightness of the emitted light is low. For these reasons, ultraviolet light emitting devices with luminescent characteristics excellent in wavelength selectivity and luminous efficiency cannot be obtained.

In contrast to these nitride-type III–V group semiconductor compounds, ZnS, $ZnS_xSe_{1-x}$, and the like, which are II–VI group semiconductor compounds, have an energy gap of a direct transition type. ZnS has a high energy gap of about 3.7 eV (corresponding to about 340 nm) at room temperature, and ZnS0.75Se0.25 has a high energy gap of about 2.95 eV (corresponding to about 420 nm) at room temperature. Furthermore, in the case of $ZnS_xSe_{1-x}$, the wavelength of ultraviolet light can be selected in the range of 420 to 340 nm by changing the mole fraction of S (i.e., x) from 0.75 to 0.95. From these reasons, ZnS and $ZnS_xSe_{1-x}$ are believed to be a suitable material for an ultraviolet light emitting device.

However, in the case of a II–VI group compound semiconductor such as ZnS, $ZnS_xSe_{1-x}$, and ZnSe, GaAs, GaP, Si, and the like are used as an epitaxial growth substrate, so that ZnS, ZnSe, and $ZnS_xSe_{1-x}$ cannot be grown on any of these substrates as a high-quality epitaxial crystal. Thus, luminescent devices obtained cannot be allowed to emit ultraviolet light with high luminous efficiency under well-controlled conditions.

SUMMARY OF THE INVENTION

The compound semiconductor luminescent device of this invention, which overcomes the above-discussed and numerous other disadvantages and deficiencies of the prior art, comprises a semiconductor substrate and a multi-layered structure disposed on said substrate, said multi-layered structure comprising at least one conductive layer, a luminescent layer, and a current injection layer, wherein said substrate and said layers are made of at least one kind of II–VI group compound semiconductor.

In a preferred embodiment, the luminescent layer is formed on said conductive layer and said current injection layer is formed on said luminescent layer.

In a preferred embodiment, the current injection layer is formed on said conductive layer and said luminescent layer is formed on said current injection layer.

In a preferred embodiment, the abovementioned compound semiconductor luminescent device further comprises a protective layer disposed on said multi-layered structure.

In a preferred embodiment, the II–VI group compound semiconductor is selected from the group consisting of ZnS, ZnSe, $ZnS_xSe_{1-x}$ (0<x<1), and $ZnS_yTe_{1-y}$ (0<y<1).

Thus, the invention described herein makes possible the objective of providing a compound semiconductor luminescent device in which a multi-layered structure comprising at least one conductive layer, a luminescent layer, and a current injection layer, all of which are made of II–VI group compound semiconductors, is disposed on a II–VI group compound semiconductor substrate, so that carriers can be effectively injected in the luminescent layer and laser light can be effectively taken out form the luminescent region to the outside of the device, resulting in an ultraviolet light emission with excellent brightness.

BRIEF DESCRIPTION OF THE DRAWINGS

This invention may be better understood and its numerous objects and advantages will become apparent to those skilled in the art by reference to the accompanying drawings as follows.

DETAILED DESCRIPTION OF THE PREFERRED EMBODIMENTS

EXAMPLE 1

Figure 1:
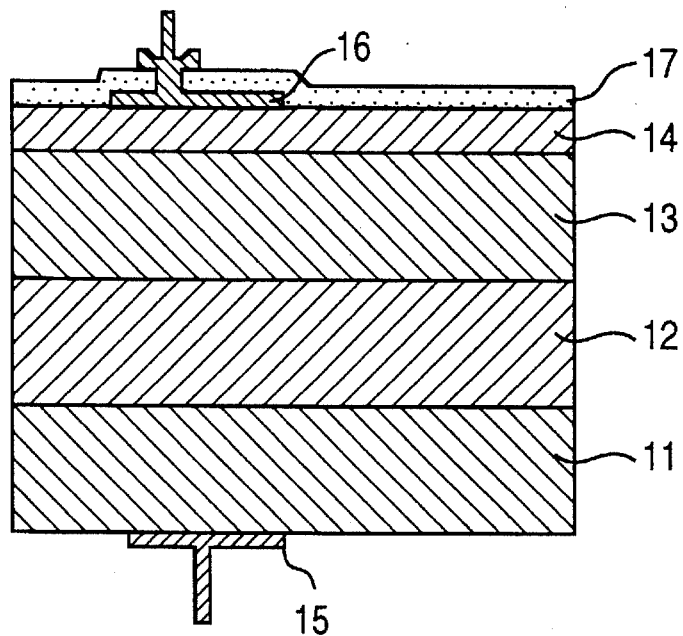
FIG. 1 is a sectional view showing a compound semiconductor luminescent device of this invention.

FIG. 1 shows a compound semiconductor luminescent device of this invention, in which an n-type ZnS conductive layer 12, an n-type ZnS luminescent layer 13, and a ZnS high-resistivity current injection layer 14 capable of transmitting ultraviolet light are successively formed on an n-type ZnS single-crystal substrate 11 by an epitaxial growth method. A metal electrode 15 which serves as a negative electrode is disposed on the n-type ZnS single-crystal substrate 11, and a metal electrode 16 for current injection is disposed on the ZnS high-resistivity current injection layer 14. The current injection metal electrode 16 and the ZnS high-resistivity current injection layer 14 are covered with a protective film 17 capable of transmitting ultraviolet light, except for the connecting terminal portion of the metal electrode 16.

The n-type ZnS single-crystal substrate 11 has a thickness of about 200 to 500 μm, and the resistivity thereof is in the range of 1 to 10 Ωcm. The n-type ZnS single-crystal substrate 11 is prepared by, for example, heat treatment of a ZnS high-resistivity bulk single crystal, which has been grown by an iodine transport method or the like, in a melt of Zn—Al (the ratio of Al being 10%) kept at about 1000° C. for about 100 hours.

The n-type ZnS conductive layer 12, the n-type ZnS luminescent layer 13, and the ZnS high-resistivity current injection layer 14 successively formed on the n-type ZnS single-crystal substrate 11 are grown by, for example, molecular beam epitaxy (MBE).

The n-type ZnS conductive layer 12 is doped with an n-type impurity such as Al so as to have a low resistance of about a few ohms or less. When the amount of Al added is in the range of $10^{18}$ to $3 \times 10^{20} cm^{-3}$ the conductive layer 12 can have an electron concentration substantially the same as the Al concentration therein. For example, when the carrier concentration is $10^{20} cm^{-3}$ and the layer thickness is 0.5 μm or more, the resistance on the surface of the conductive layer 12 can be several ohms. When the carrier concentration is $10^{19} cm^{-3}$ and the layer thickness is about 3 μm, the resistance on the surface of the conductive layer 12 can be 10Ω or less. As an n-type impurity element, gallium (Ga), indium (In), thallium (Tl), chlorine (Cl), fluorine (F), bromine (Br), iodine (I), silicon (Si), germanium (Ge), or the like can also be used, as well as Al mentioned above.

The n-type ZnS luminescent layer 13 is doped with an n-type impurity in the same way as for the above-mentioned conductive layer 12. The luminescent layer 13 in this Example has a resistivity of about $10^{-2}$ to 10 Ωcm and a carrier concentration of $10^{19} cm^{-3}$ or less.

In the luminescent layer 13, to convert energy released by the recombination of injected carriers to ultraviolet light with high efficiency, the luminescent centers which cause light emission other than ultraviolet light, that is, the luminescent centers in deep energy levels must be reduced as much as possible. In this example, because the luminescent layer 13 is composed of a homoepitaxial ZnS layer with high crystallinity, ultraviolet light of high intensity can be emitted when the carrier concentration is $2 \times 10^{19} cm^{-3}$ or less. Although the thickness of the luminescent layer 13 varies depending on the carrier concentration, ultraviolet light of sufficiently high intensity can be emitted when the thickness of the luminescent layer 13 is 0.5 μm or more.

The ZnS high-resistivity current injection layer 14 is a layer for injecting holes to the luminescent layer 13. The current injection layer 14 must have high resistance and high crystallinity. To allow the current injection layer 14 to have high resistance, the addition of an impurity is effective. As an impurity element to be added, it is preferable to use lithium (Li), sodium (Na), potassium (K), calcium (Ca), strontium (Sr), copper (Cu), silver (Ag), gold (Au), nitrogen (N), phosphorus (P), arsenic (As), antimony (Sb), silicon (Si), germanium (Ge), carbon (C), oxygen (O), or the like. By adding at least one kind of these elements at a concentration of $10^{19} cm^{-3}$ or less, a stable high-resistivity layer can be obtained.

In order that the high-resistivity current injection layer 14 is allowed to transmit the emitted ultraviolet light with a wavelength of 337 to 340 nm, the thickness of this layer is required to be about 0.5 μm or less. To cause effective carrier injection, the layer thickness is preferably set to 0.1 μm or less. Moreover, the layer thickness is set to 2 nm or more so that the current injection layer 14 is not damaged when a voltage is applied thereto.

The metal electrode 16 for current injection (i.e., for hole injection) disposed on the high-resistivity current injection layer 14 is preferably made of gold or platinum. A very stable electrode with high density can be obtained by thermal deposition or electron-beam deposition of these metals under a very highly reduced pressure of $10^{-8}$ to $10^{-9}$ Torr which is higher than the ordinary reduced pressure of $10^{-5}$ to $10^{-6}$ Torr for vacuum deposition of forming an electrode. When a thin film of gold or platinum is used as the metal electrode 16, the metal thin film with a thickness of about 2.5 nm is sufficient to function as an electrode. Moreover, the metal electrode 16 with such a thickness can transmit ultraviolet light. When the metal electrode 16 is a thin film with a thickness of about 2.5 to 10 nm, internal resistance of the metal electrode increases. To decrease the internal resistance, the connecting terminal portion of the metal electrode is formed to have a thickness of about 50 to 100 nm, or the metal electrode is divided into two or more portions.

The ultraviolet light transmitting protective film 17, which is disposed to cover both the metal electrode 16 and the current injection layer 14, is an insulating film with a high transmittance to light in the region of ultraviolet light. The protective film 17 is formed by a method such as sputtering, or optical or thermal chemical vapor deposition. As described above, both the high-resistivity current injection layer 14 and the metal electrode 16 for current injection are thin, so that they may deteriorate in an atmosphere when ultraviolet light is emitted. However, the coating of the high-resistive current injection layer 14 and the metal electrode 16 for current injection with the protective film 17 in this way prevent them from deteriorating.

With the use of at least one kind of compounds including $Al_2O_3$, $Si_3N_4$, AlN, BN, KCl, KBr, KF, NaCl, NaBr, NaF, $CaF_2$, $CaBr_2$, $SrF_2$, $SrBr_2$, $CaCl_2$, $SrCl_2$, $BaF_2$, CaS, CaSe, SrS, SrSe, BaS, and BaSe, or with the use of at least one kind of mixtures of these compounds with ZnS or $ZnS_xSe_{1-x}$, as the protective film 17, it is possible to obtain a luminescent device with excellent heat resistance (100° C. or less) and excellent moisture resistance (90% or less).

The metal electrode 15 as the negative electrode disposed on the n-type ZnS single-crystal substrate 11 is formed by vacuum deposition of at least one kind of In, Al, or Ga on the substrate 11. The metal electrode 15 formed in this way has an excellent ohmic contact with the ZnS substrate 11. Also, when the metal electrode 15 is deposed at a very highly reduced pressure of $10^{-8}$ to $10^{-9}$ Torr, the contact resistance of this electrode is further decreased.

The compound semiconductor luminescent device with such a structure operated very stably at an applied voltage of 5–10 V and at a current value of 0.1–100 mA, and ultraviolet light emission of 338 nm was obtained. When the carrier concentration in the luminescent layer 13 is $2\times10^{18} cm^{-3}$ or more, a wide blue luminescent band having a peak at around 460 nm is produced by doping. Because the intensity of light emission is one half or less than the intensity of light having a peak at 338 nm, only the intensity of ultraviolet light having a peak at 338 nm is increased when the amount of injection current is increased. When the concentration of carriers in the luminescent layer 13 is $1\times10^{17} cm^{-3}$ light emission at around 460 nm can almost be ignored, even at a low current of 1 mA or less, in comparison with ultraviolet light having a peak at 338 nm.

Although in the above-mentioned Example, the ZnS conductive layer 12, the ZnS luminescent layer 13, and the ZnS high-resistivity current injection layer 14 are successively grown on the ZnS single-crystal substrate 11 by an MBE method to produce a compound semiconductor luminescent device, a compound semiconductor luminescent device with the same structure can also be obtained by an MOCVD method As described above, because epitaxially grown layers including a luminescent layer have completely the same composition as that of the substrate (i.e., homoepitaxial growth), the quality of the epitaxially grown layers is considerably improved, and the density of defects is about one hundredth that of conventional luminescent devices. As a result, compared with conventional luminescent devices in which a ZnS epitaxially grown layer is formed on a substrate such as gallium arsenide (GaAs), gallium phosphide (GAP), or silicon (Si), (i.e., a heteroepitaxially grown layer), the brightness of ultraviolet light emission itself is improved tenfold or more, and the efficiency of current injection and the luminous efficiency are also considerably improved.

EXAMPLE 2

Figure 2:
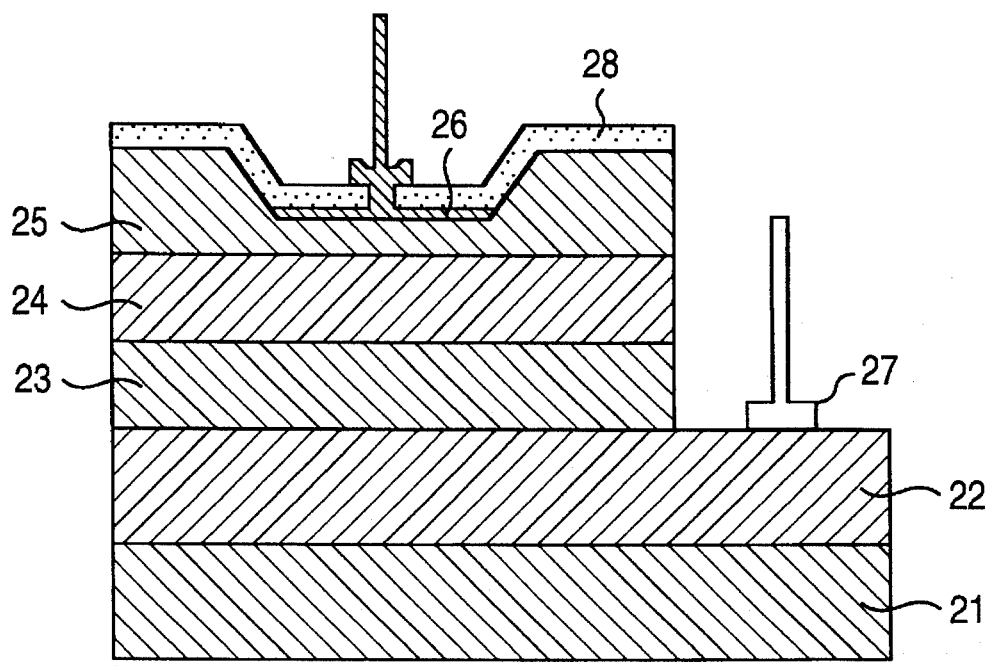
FIG. 2 is a sectional view showing another compound semiconductor luminescent device of this invention.

FIG. 2 shows another compound semiconductor luminescent device of this invention. In this luminescent device, an n-type ZnS low-resistivity conductive layer 22 is formed on a high-resistivity ZnS single-crystal substrate 21 by an epitaxial growth method. On the conductive layer 22 except for its one edge portion, an n-type $ZnS_xSe_{1-x}$ low-resistivity conductive layer 23, an n-type $ZnS_xSe_{1-x}$ low-resistivity luminescent layer 24, and a ZnS high-resistivity current injection layer 25 are successively formed by an epitaxial growth method, for example, an MBE method. On the portion of the conductive layer 22 other than the edge portion on which the n-type $ZnS_xSe_{1-x}$ low-resistivity conductive layer 23 is formed, a negative electrode 27 is disposed. In the center of the ZnS high-resistivity current injection layer 25, there is provided a recessed portion so that the center portion becomes thin, and a positive electrode 26 is disposed on the bottom surface of the recessed portion. Thus, current is injected to the luminescent layer 24 through the thin portion of the current injection layer 25.

The upper surface of the ZnS high-resistivity current injection layer 25 and the upper surface of the positive electrode 26 are coated with a protective film 28, except for the connecting terminal portion of the electrode 26.

The luminescent device has cleavage planes perpendicular to each epitaxially grown layer, and ultraviolet light is emitted from these cleavage planes and the upper surface of the ZnS high-resistivity current injection layer 25.

In the luminescent device of this Example, a high-resistivity ZnS single-crystal substrate 21 is used in place of the n-type single-crystal substrate 11 of the Example 1. Therefore, the ZnS single-crystal substrate 21 can be formed by an iodine transport method, a sublimation method, or the like, but heat treatment of the substrate 21 is not required as was the case for the substrate 11 of Example 1.

The n-type ZnS low-resistivity conductive layer 22 formed on the substrate 21, is doped with an n-type impurity such as Al at a concentration of $4\times10^{19} cm^{-3}$ in the same way as that of Example 1, so that the concentration of carriers is $3.5\times10^{19} cm^{-3}$, and further the n-type ZnS low-resistivity conductive layer 22 has a thickness of 3 μm, so that the surface resistance within the layer is 5Ω or less.

The n-type $ZnS_xSe_{1-x}$ conductive layer 23 formed on the n-type ZnS low-resistivity conductive layer 22 is also doped with Al as an n-type impurity so as to have low resistance in the same level as that of the n-type ZnS low-resistivity conductive layer 22. The mole fraction x of S in the n-type $ZnS_xSe_{1-x}$ conductive layer 23 is set to a value in the range of 0.75 to 0.95 so that the ultraviolet light emission wavelength of the luminescent device of this example falls in the range of 340 to 420 nm.

In the laminate structure composed of the n-type ZnS low-resistivity conductive layer 22 and the n-type $ZnS_xSe_{1-x}$ conductive layer 23, when an n-type $ZnS_xSe_{1-x}$ low-resistivity layer is epitaxially grown on the n-type ZnS low-resistivity conductive layer 22, a difference between the lattice constants will occur. However, by gradually increasing the ratio of Se when the $ZnS_xSe_{1-x}$ low-resistivity conductive layer 23 is grown, the $ZnS_xSe_{1-x}$ low-resistivity conductive layer 23 with excellent crystallinity can be obtained. Moreover, because the constituent elements of these low-resistivity conductive layers 22 and 23 are group II and VI elements, these constituent elements do not have a tendency to become an impurity for each other, so that electrical and optical properties of each layer can be controlled very readily. This feature is quite different from the case where a heteroepitaxial growth is performed by the use of a substrate of GaAs, GaP, Si, or the like.

In the n-type $ZnS_xSe_{1-x}$ conductive layer 23, when the same amount of Al is added thereto, the carrier concentration increases as the mole fraction x decreases. Therefore, even when the mole fraction x of S is about 0.75, the thickness of the conductive layer of 0.5 μm or more is sufficient. In the n-type $ZnS_xSe_{1-x}$ low-resistivity luminescent layer 24 formed on the n-type $ZnS_xSe_{1-x}$ conductive layer 23, when the concentration of Al added as an n-type impurity is $5\times10^{18} cm^{-3}$ or less, light emission from the luminescent layer 23 gives substantially ultraviolet light with a wavelength of 340 to 420 nm, so that light emission in the wavelength range of in the wavelength range of 470 to 600 nm from deep energy levels generated by doping can virtually be ignored.

Because ultraviolet light emitted from the n-type $ZnS_xSe_{1-x}$ low-resistivity luminescent layer 24 is of a wavelength equal to or longer than the absorption edge wavelength (i.e., 335 nm) of the ZnS high-resistivity current injection layer 25, no consideration of the absorption by the ZnS high-resistivity current injection layer 25 is required. The thickness of the thin film portion, which is formed by the recessed portion provided in the center of the ZnS high-resistivity current injection layer 25, is set to a value of 2 to 100 nm so that carriers (i.e., holes) can sufficiently be injected. The thickness of the peripheral portion of the ZnS high-resistivity current injection layer 25 is set to 1 μm or more. Such a structure of the ZnS high-resistivity current injection layer 25 allows the ultraviolet light emitted from the luminescent layer 24 to be guided along the junction plane between the luminescent layer 24 and the high-resistivity current injection layer 25, so that the ultraviolet light can be taken out from the cleavage planes as well as from the upper surface of the high-resistivity current injection layer 25.

The recessed portion of the ZnS high-resistivity current injection layer 25 is formed by irradiating with light while the ZnS high-resistivity current injection layer 25 is grown by an MBE method. The irradiation light is generated by, for example, a He—Cd laser with an output power of 20 mW at a wavelength of 325 nm. For example, when the planer dimensions of the luminescent device is 2 mm×2 mm, the laser light is irradiated at an output power of 1 to 5 mW, within a circle of 1 mm in diameter at the center of the ZnS high-resistivity current injection layer 25. The laser light is irradiated at the time when the thin film portion, in which current will be injected, of the ZnS high-resistivity current injection layer 25 is grown to have a desired thickness (e.g., 30 nm). Then, the growth of ZnS in the irradiated region is stopped, and ZnS is grown only on the peripheral portion other than the irradiated region for about 30 minutes to 3 hours so that the thickness of the ZnS is about 1 to 5 μm, resulting in a ZnS high-resistivity current injection layer 25 with a recessed portion.

To form the recessed portion of the ZnS high-resistivity current injection layer 25, light separated from Xe lamp light containing ultraviolet light with an output power of about 10 mW/nm or more, SHG light of either an excimer laser or Ar laser, or THG light of a YAG laser, or the like, can be used, as well as He—Cd laser light.

The high-resistivity current injection layer 25 is not limited to ZnS, but $ZnS_yTe_{1-y}$ (the mole fraction y of S being 0.9 to 1.0) can be used. In this case, a high-resistivity current injection layer with high quality can be obtained, which improves current injection efficiency. As an impurity for controlling resistance in this case, the impurity added to the ZnS high-resistivity current injection layer 14 of Example 1 can also be used.

The protective film 28 which covers the ZnS high-resistivity current injection layer 25 and the positive electrode 26 is the same as the protective film 17 of Example 1, and the negative electrode 27 is the same as the negative electrode 15 of Example 1.

In the compound semiconductor luminescent device of this Example, as described above, the peak wavelength of ultraviolet light emitted depends on the mole fraction x of S in the n-type $ZnS_xSe_{1-x}$ low-resistivity luminescent layer 24, and ultraviolet light with a wavelength in the range of 340 to 420 nm is emitted with high brightness at a half-value width of about 2 to 5 nm.

EXAMPLE 3

Figure 3:
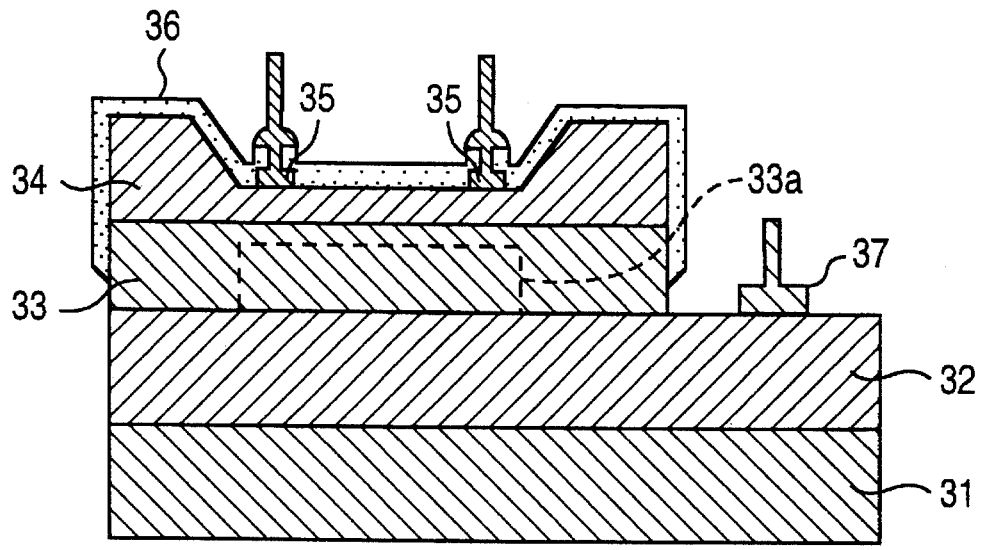
FIG. 3 is a sectional view showing still another compound semiconductor luminescent device of this invention.

FIG. 3 shows still another compound semiconductor luminescent device of this invention. In the luminescent device, an n-type ZnS low-resistivity conductive layer 32 is formed on a ZnS high-resistivity single-crystal substrate 31 by an epitaxial method. On the ZnS low-resistivity conductive layer 32 except for its one edge portion, an n-type ZnS luminescent layer 33 and a p-type ZnS current injection layer 34 are successively formed by an epitaxial method. There is provided a recessed portion at the center of the p-type ZnS current injection layer 34 so that a thin portion is formed. On the thin portion of the p-type ZnS low-resistivity current injection layer 34, a pair of positive electrodes 35 are provided at an appropriate interval.

Within the n-type ZnS low-resistivity luminescent layer 33, a low-resistivity conductive region 33a formed by ion beam doping is provided so as to face the thin portion of the p-type ZnS high-resistivity current injection layer The upper surface of the p-type ZnS current injection layer 34 and the respective positive electrodes 35 are covered with an insulating protective film 36, except for the connecting terminal portions of the respective positive electrodes 35. The protective film 36 covers the side surfaces of the current injection layer 34 and most of the side surfaces of the n-type ZnS low-resistivity luminescent layer 33 under the current injection layer 34.

On one edge portion of the n-type ZnS low-resistivity conductive layer 32, a negative electrode 37 is disposed.

The n-type ZnS low-resistivity conductive layer 32, is doped with Al or the like as an n-type impurity in the same way as in Examples 1 and 2, so that the concentration of carriers is $5\times10^{19} cm^{-3}$ and the layer thickness is set to 2 μm. The n-type ZnS low-resistivity luminescent layer 33 formed on the conductive layer 32 is doped with the same n-type impurity as above, so that the concentration of carriers is $5\times10^{18} cm^{-3}$. From the luminescent layer 33, ultraviolet light of 335 to 338 nm corresponding to the energy gap of ZnS is emitted. The low-resistivity conductive region 33a is formed within the luminescent layer 33 by the use of focused ion beams such as Al, In, Ga, Cl, I, F, or Br, together with the above n-type impurity, at the early stage of the formation of the luminescent layer 33 formation. The conductive region 33a is doped with the use of ion beams so that a predetermined region within the luminescent layer 33 has a thickness of about 0.5 to 3 μm, resulting in a high carrier concentration (in the range of $1\times10^{19}$ to $2\times10^{20} cm^{-3}$). The resistance value of the conductive region 33a is set smaller than that of the luminescent layer 33 by a factor 10, so that a current density in the luminescent region within the luminescent layer can be increased. Accordingly, ultraviolet light by band-to-band light emission can be increased at substantially the same increment as that of the current density.

In the same way as the current injection layer 25 of Example 2, the p-type ZnS current injection layer 34 is formed on the luminescent layer 33 so as to have a thin portion with a thickness of part 0.5 μm or less at the center thereof, and a thick portion surrounding this thin portion is set to have a thickness of 1 to 5 μm.

The luminescent device of such a construction emits high-brightness ultraviolet light with a wavelength of 337 to 338 nm from both the upper surface and the cleaved end surfaces at room temperature. In the luminescent device, current begins to flow at an applied voltage near 3 V, and current of 1 to 100 mA flows at a voltage of 3.5 to 4 V. The emitted ultraviolet light has such a brightness that green or blue fluorescent substances for use in cathode ray tube color displays can emit light with a sufficient brightness, and the luminous efficiency can be increased $10^2$- to $10^3$-fold as compared with that of a conventional luminescent device.

EXAMPLE 4

Figure 4:
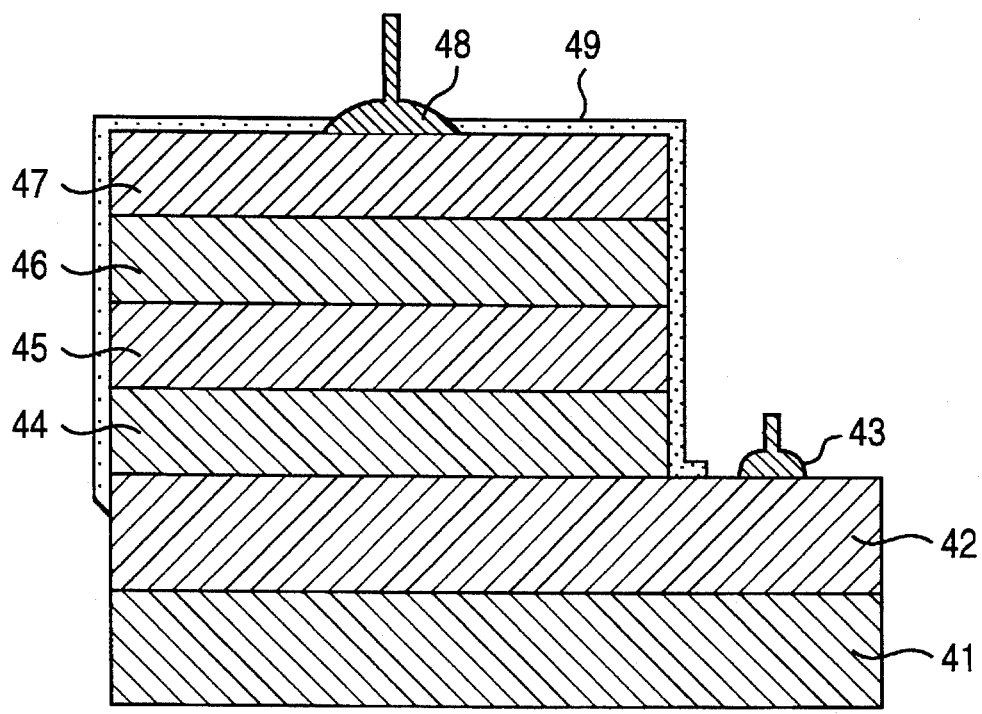
FIG. 4 is a sectional view showing still another compound semiconductor luminescent device of this invention.
Figure 5:
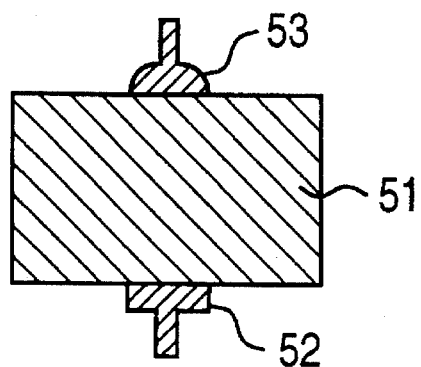
FIG. 5 is a sectional view showing a conventional compound semiconductor luminescent device.
Figure 6:
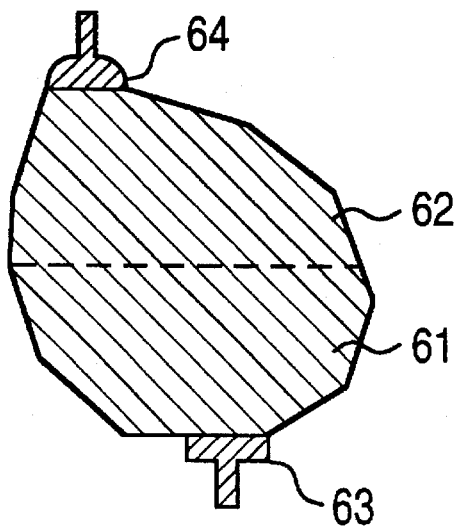
FIG. 6 is a sectional view showing another conventional compound semiconductor luminescent device.

FIG. 4 shows still another compound semiconductor luminescent device of this invention. In this luminescent device, an n-type ZnS low-resistivity conductive layer 42 is formed on a ZnS single-crystal substrate 41 by an epitaxial growth method. A negative electrode 43 is disposed on one edge portion of the conductive layer 42. On the conductive layer 42 except for its one edge portion, an n-type $ZnS_zSe_{1-z}$ low-resistivity conductive layer 44, an n-type $ZnS_zSe_{1-z}$ low-resistivity luminescent layer 45, a p-type $ZnS_zSe_{1-z}$ current injection layer 46, and a p-type $ZnS_tSe_{1-t}$ protective layer 47 are successively formed by an epitaxial growth method. A positive electrode 48 is disposed on the protective layer 47. The upper surface of the protective layer 47 except for the region of the electrode 48 disposed, and both side surfaces of the protective layer 47, the current injection layer 46, the luminescent layer 45, and the conductive layer 44 are covered with an insulating protective film 49.

The n-type ZnS low-resistivity conductive layer 42 and the n-type $ZnS_zSe_{1-z}$ low-resistivity conductive layer 44 are doped with an n-type impurity so as to have low resistance, in the same way as the n-type ZnS low-resistivity conductive layer 22 and the n-type $ZnS_xSe_{1-x}$ low-resistivity conductive layer 23 of Example 2.

In the $ZnS_zSe_{1-z}$ low-resistivity luminescent layer 45, the molar ratio z of S, which determines the wavelength of ultraviolet light to be emitted, is set to a value of 0.95 to 0.75, so that ultraviolet light with a wavelength of 340 to 420 nm is emitted in a similar manner to that of Example 2.

The p-type $ZnS_zSe_{1-z}$ current injection layer 46 is doped with a p-type impurity such as As, and the concentration of carriers is $1 \times 10^{17} cm^{-3}$. As the p-type impurity, at least one selected from the group consisting of O, C, N, P, Sb, Cu, Ag, Li, Na, K, Rb, Tl, Si, and Ge, can be used. When the carrier concentration of the current injection layer 46 is $1 \times 10^{18} cm^{-3}$ or less, a sufficiently high-quality layer can be obtained, and luminescent centers at deep energy levels, which are formed by the addition of a p-type impurity to the current injection layer 46, are not generated to the extent that they have an effect on the light emission characteristics. When the carrier concentration of the current injection layer 46 exceeds the above limit, an added impurity becomes highly concentrated. For example, when As is used as a p-type impurity, a very wide reddish-orange light emission, the peak wavelength of which is in the neighborhood of 600 nm, is predominant, so that ultraviolet light cannot be emitted with high efficiency. To obtain the carrier concentration of the current injection layer 46 of $1 \times 10^{18} cm^{-3}$ the amount of As supplied at the time of the epitaxial growth by an MBE method must be increased to about $1 \times 10^{20} cm^{-3}$. However when the amount of As is increased more than about $1 \times 10^{20} cm^{-3}$ to further increase the carrier concentration, the crystallinity of the current injection layer 46 decreases. The thickness of the current injection layer 46 is preferably 2 μm or more.

For the p-type $ZnS_tSe_{1-t}$ protective layer 47 formed on the current injection layer 46, the mole fraction t of S is set to satisfy the inequality $z+0.05 \leq t \leq 1$ with respect to the mole fraction z of S for the p-type $ZnS_zSe_{1-z}$ current injection layer so that ultraviolet light emitted from the luminescent layer 45 can be taken out of the luminescent device effectively. The ultraviolet light can pass through protective layer 47, and is emitted to the-outside. For the p-type impurity added to the protective layer 47, the same p-type impurity as that added to the current injection layer 46 can be used. The carrier concentration determined by the addition of a p-type impurity determines resistivity. Furthermore, depending on the carrier concentration, secondary light emission may occur because of the luminescent centers formed at deep energy levels and the excitation of the ultraviolet light, so that the carrier concentration is set to about $5 \times 10^{17} cm^{-3}$ or less. The thickness of the protective layer 47 is set to 2 μm or more.

The luminescent device of this Example can emit ultraviolet light with high efficiency in a similar manner to the luminescent device of Example 3.

Although the luminescent device of this Example is produced by the growth of compound semiconductors using an MBE method, but it can also be produced by the growth of compound semiconductors using an MOCVD method.

In the structure of the luminescent device of this Example, the n-type and p-type layers can be interchanged with each other. That is, the p-type ZnS low-resistivity conductive layer 42', the p-type $ZnS_zSe_{1-z}$ low-resistivity conductive layer 44', the p-type $ZnS_zSe_{1-z}$ current injection layer 45', an n-type $ZnS_zSe_{1-z}$ low-resistivity luminescent layer 46', and the n-type $ZnS_tSe_{1-t}$ protective layer 47' are successively formed on the ZnS single-crystal substrate 41 by an epitaxial growth method. In this structure, the electrical and optical properties of the p-type and n-type epitaxially grown layers can be controlled well over a wide range with ease. Therefore, the excellent electrical characteristics (i.e., carrier concentration) rather than the optical characteristics of the p-type layer 45' as a current injection layer are secured. That is, the efficiency of carrier injection to the luminescent layer 46' can be improved by increasing the carrier concentration of the p-type layer 45' to $5 \times 10^{18} cm^{-3}$. In this case, because the above-mentioned p-type impurity of a high concentration reaching $10^{20} cm^{-3}$ is added in the p-type layer 45', the intensity of light emission having peaks at around 550 and 630 nm from deep levels is predominant, so that the optical characteristics of the p-type layer 45' is poor. However, because the p-type 45' layer has little contribution to the light emission, this layer does not exert an undesirable effect to device characteristics. The injection of carriers to the n-type luminescent layer 46' at a sufficient concentration enables current injection light emission to occur under conditions in which light emission from deep levels is sufficiently reduced and ultraviolet light emission is made predominant by setting the carrier concentration in this n-type luminescent layer 46' to a relatively low value of $5 \times 10^{16}$ to $5 \times 10^{18} cm^{-3}$. Thus the luminous efficiency of ultraviolet light can be improved. In particular, when the carrier concentration is about $1 \times 10^{18} cm^{-3}$ luminous efficiency about three times higher as compared with the luminescent device of Example 4 was obtained.

Although a ZnS single crystal was used as a substrate in all the Examples described above, a ZnSe single crystal, $ZnS_uSe_{1-u}$ single crystal, or the like, can also be used, which is grown by a high-pressure melting method, a sublimation method such as the Piper-Polich method, an iodine transport method, or the like.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A compound semiconductor luminescent device, comprising:

a semiconductor substrate;

a multi-layered structure epitaxially grown on said substrate, said multi-layered structure comprising at least one conductive layer formed on said substrate;

a current infection layer formed on said conductive layer;

a luminescent layer formed on said current injection layer;

a negative metal electrode disposed on a back face of said substrate or on an upper face of said conductive layer;

a positive metal electrode disposed on an upper face of said multi-layered structure; and a protective layer capable of transmitting light generated in the luminescent layer, which is disposed on said multi-layered structure so as to cover part of said positive metal electrode, wherein said semiconductor substrate, conductive layer and luminescent layer are made of at least one kind of II–VI group compound semiconductor.

2. A compound semiconductor luminescent device according to claim 1, wherein said II–VI group compound semiconductor is selected from the group consisting of ZnS, ZnSe, $ZnS_xSe_{1-x}$ ($0<x<1$), and $ZnS_yTe_{1-y}$ ($0<y<1$).

3. A compound semiconductor luminescent device, comprising:

a ZnS single-crystal substrate of a first conductivity type;

a conductive layer of the first conductivity type formed on said substrate and made of a material selected from the group consisting of ZnS, ZnSe, $ZnS_xSe_{1-x}$ ($0<x<1$) and $ZnS_yTe_{1-y}$ ($0<y<1$);

a luminescent layer of the first conductivity type formed on said conductive layer and made of a material selected from the group consisting of ZnS, ZnSe, $ZnS_xSe_{1-x}$ ($0<x<1$) and $ZnS_yTe_{1-y}$ ($0<y<1$);

a low-resistivity current injection layer of a second conductivity type formed on said luminescent layer and made of a material selected from the group consisting of ZnS, ZnSe, $ZnS_xSE_{1-x}$ ($0<x<1$) and $ZnS_yTe_{1-y}$ ($0<y<1$);

a negative metal electrode disposed on a back face of said substrate;

a positive metal electrode disposed on an upper face of said current injection layer; and a protective film capable of transmitting light generated in the luminescent layer, which is formed on said current injection layer so as to cover part of said positive metal electrode.

4. A compound semiconductor luminescent device, comprising:

a semiconductor substrate;

a multi-layered structure epitaxially grown on said substrate, said multi-layered structure comprising at least one conductive layer formed on said substrate;

a luminescent layer formed on said conductive layer;

a current injection layer formed on said luminescent layer;

a negative metal electrode disposed on an upper face of said conductive layer;

a positive metal electrode disposed on an upper face of said multi-layered structure; and a protective layer capable of transmitting light generated in the luminescent layer, which is disposed on said multi-layered structure so as to cover part of said positive metal electrode, wherein said substrate layer, conductive layer and luminescent layer is made of at least one kind of II–VI group compound semiconductor.

5. A compound semiconductor luminescent device according to claim 4, wherein said II–VI group compound semiconductor is selected from the group consisting of ZnS, ZnSe, $ZnS_xSE_{1-x}$ ($0<x<1$), and $ZnS_yTe_{1-y}$ ($0<y<1$).

* * * * *